(12) United States Patent
Masunishi et al.

(10) Patent No.: US 12,019,092 B2
(45) Date of Patent: Jun. 25, 2024

(54) SENSOR AND ELECTRONIC DEVICE

(71) Applicant: KABUSHIKI KAISHA TOSHIBA, Tokyo (JP)

(72) Inventors: Kei Masunishi, Kawasaki Kanagawa (JP); Yasushi Tomizawa, Tokyo (JP); Etsuji Ogawa, Kawasaki Kanagawa (JP); Ryunosuke Gando, Yokohama Kanagawa (JP); Shiori Kaji, Kawasaki Kanagawa (JP); Hiroki Hiraga, Saitama Saitama (JP); Fumito Miyazaki, Yokohama Kanagawa (JP); Daiki Ono, Yokohama Kanagawa (JP); Kengo Uchida, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/680,263

(22) Filed: Feb. 24, 2022

(65) Prior Publication Data

US 2023/0062441 A1    Mar. 2, 2023

(30) Foreign Application Priority Data

Sep. 2, 2021   (JP) ................. 2021-143209

(51) Int. Cl.
*G01P 15/097*   (2006.01)
*B81B 3/00*   (2006.01)

(52) U.S. Cl.
CPC .......... *G01P 15/097* (2013.01); *B81B 3/0021* (2013.01); *B81B 2201/0235* (2013.01)

(58) Field of Classification Search
CPC .................................................. G01P 15/097

(Continued)

(56) References Cited

U.S. PATENT DOCUMENTS 6,240,782 B1   6/2001   Kato et al.
11,493,531 B2 *   11/2022   Reinke ................. B81B 3/0021
(Continued)

FOREIGN PATENT DOCUMENTS

JP   H4-115165 A   4/1992
JP   H11-173851 A   7/1999
(Continued)

OTHER PUBLICATIONS

D.D. Shin et al., "Environmentally Robust Differential Resonant Accelerometer in a Wafer-Scale Encapsulation Process," IEEE MEMS 2017, pp. 17-20 (2017).

*Primary Examiner* — Walter L Lindsay, Jr.
*Assistant Examiner* — Philip T Fadul
(74) *Attorney, Agent, or Firm* — Finnegan, Henderson, Farabow, Garrett & Dunner, LLP

(57) ABSTRACT

According to one embodiment, a sensor a sensor includes a base, a first support portion fixed to the base, and a first movable portion supported by the first support portion. The first movable portion includes first and second movable base portions, a connecting base portion, first and second movable beams, and first and second movable conductive portions. The first movable beam includes a first beam end portion, a first beam other end portion, and a first beam intermediate portion. The second movable beam includes a second beam end portion, a second beam other end portion, and a second beam intermediate portion. The first movable conductive portion includes a first crossing conductive portion, a first extending conductive portion, and a first other extending conductive portion. The second movable conductive portion includes a second crossing conductive portion, a second extending conductive portion, and a second other extending conductive portion.

16 Claims, 11 Drawing Sheets

(58) Field of Classification Search
USPC .......................................................... 73/1.38
See application file for complete search history.

(56) References Cited

U.S. PATENT DOCUMENTS

| | | | |
|---|---|---|---|
| 2002/0023492 A1 | 2/2002 | Sakai et al. | |
| 2005/0076714 A1* | 4/2005 | Sakai | G01P 15/125 |
| | | | 73/514.32 |
| 2009/0255339 A1 | 10/2009 | McNeil et al. | |
| 2016/0152202 A1 | 6/2016 | Rytkonen et al. | |
| 2018/0238688 A1* | 8/2018 | Kikuchi | G01P 15/097 |
| 2019/0187171 A1 | 6/2019 | Takizawa | |
| 2020/0025792 A1 | 1/2020 | Reinke | |
| 2020/0096536 A1 | 3/2020 | Zou et al. | |
| 2021/0140992 A1 | 5/2021 | Reinke | |
| 2021/0396780 A1 | 12/2021 | Masunishi et al. | |

FOREIGN PATENT DOCUMENTS

| | | |
|---|---|---|
| JP | 2002-71707 A | 3/2002 |
| JP | 2019-109140 A | 7/2019 |
| JP | 2022-1828 A | 1/2022 |

* cited by examiner

SENSOR AND ELECTRONIC DEVICE

CROSS-REFERENCE TO RELATED APPLICATIONS

This application is based upon and claims the benefit of priority from Japanese Patent Application No. 2021-143209, filed on Sep. 2, 2021; the entire contents of which are incorporated herein by reference.

FIELD

Embodiments described herein relate generally to a sensor and an electronic device.

BACKGROUND

For example, there is a sensor using a MEMS structure. It is desired to improve the characteristics of the sensor.

DETAILED DESCRIPTION

Figure 1A:
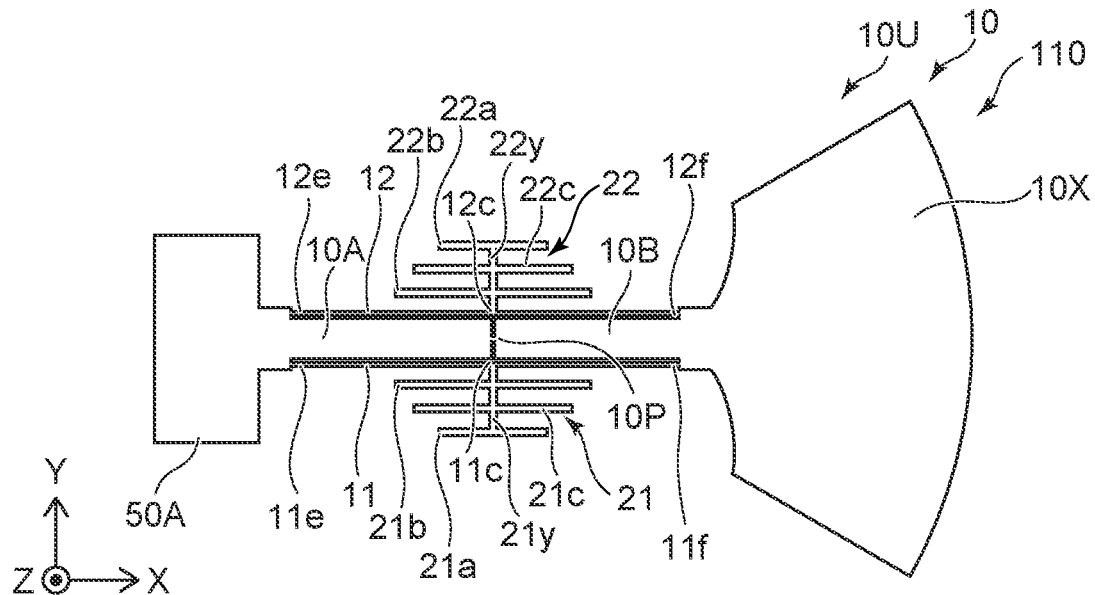
FIGS. 1A and 1B are schematic views illustrating a sensor according to the a first embodiment.

According to one embodiment, a sensor includes a base, a first support portion, and a first movable portion. The first support portion is fixed to the base. The first movable portion is supported by the first support portion and separated from the base. The first movable portion includes a first movable base portion, a second movable base portion, a connecting base portion, a first movable beam, a second movable beam, a first movable conductive portion, and a second movable conductive portion. The first movable base portion is supported by the first support portion. A second direction from the first movable base portion to the second movable base portion crosses a first direction from the base to the first movable portion. The connecting base portion is provided between the first movable base portion and the second movable base portion. The connecting base portion connects the second movable base portion to the first movable base portion. The first movable beam includes a first beam end portion, a first beam other end portion, and a first beam intermediate portion. The first beam end portion is connected with the first movable base portion. The first beam other end portion is connected with the second movable base portion. The first beam intermediate portion is located between the first beam end portion and the first beam other end portion. The second movable beam includes a second beam end portion, a second beam other end portion, and a second beam intermediate portion. The second beam end portion is connected with the first movable base portion. The second beam other end portion is connected with the second movable base portion. The second beam intermediate portion is located between the second beam end portion and the second beam other end portion. The connection base portion is located between the first beam intermediate portion and the second beam intermediate portion in a third direction crossing a plane including the first direction and the second direction. The first movable conductive portion is connected with the first beam intermediate portion. The first beam intermediate portion is located between the first movable conductive portion and the connecting base portion in the third direction. The first movable conductive portion includes a first crossing conductive portion connected with the first beam intermediate portion and extending along the third direction, a first extending conductive portion connected with the first crossing conductive portion and extending along the second direction, and a first other extending conductive portion connected with the first crossing conductive portion and extending along the second direction. The first other extending conductive portion is located between the first extending conductive portion and the first beam intermediate portion in the third direction. The second movable conductive portion is connected with the second beam intermediate portion. The second beam intermediate portion is located between the connecting base portion and the second movable conductive portion in the third direction. The second movable conductive portion includes a second crossing conductive portion connected with the second beam intermediate portion and extending along the third direction, a second extending conductive portion connected with the second crossing conductive portion and extending along the second direction, and a second other extending conductive portion connected with the second crossing conductive portion and extending along the second direction. The second other extending conductive portion is located between the second beam intermediate portion and the second extending conductive portion in the third direction.

According to one embodiment, a sensor includes a base, a first support portion fixed to the base, and a first movable portion supported by the first support portion and separated from the base. The first movable portion includes a first movable base portion, a second movable base portion, a connecting base portion, a first movable beam, a second movable beam, a first movable conductive portion, and a second movable conductive portion. The first movable base portion is supported by the first support portion. A second direction from the first movable base portion to the second movable base portion crosses a first direction from the base to the first movable portion. The connecting base portion is provided between the first movable base portion and the second movable base portion. The connecting base portion connects the second movable base portion to the first movable base portion. The first movable beam includes a first beam end portion, a first beam other end portion, and a first beam intermediate portion. The first beam end portion is connected with the first movable base portion. The first beam other end portion is connected with the second movable base portion. The first beam intermediate portion is located between the first beam end portion and the first beam other end portion. The second movable beam includes a second beam end portion, a second beam other end portion, and a second beam intermediate portion. The second beam end portion is connected with the first movable base portion. The second beam other end portion is connected with the second movable base portion. The second beam intermediate portion is located between the second beam end portion and the second beam other end portion. The connection base portion is located between the first beam intermediate portion and the second beam intermediate portion in a third direction crossing a plane including the first direction and the second direction. The first movable conductive portion is connected with the first beam intermediate portion. The first beam intermediate portion is located between the first movable conductive portion and the connecting base portion in the third direction. The first movable conductive portion includes a first extending conductive portion connected extending along the second direction. The second movable conductive portion is connected with the second beam intermediate portion. The second beam intermediate portion is located between the connecting base portion and the second movable conductive portion in the third direction. The second movable conductive portion includes a second extending conductive portion extending along the second direction. The first movable conductive portion includes one or more first holes. The second movable conductive portion includes one or more second holes. A sum of areas of the one or more second holes in a plane including the second direction and the third direction is different from a sum of areas of the one or more first holes in the plane.

According to one embodiment, an electronic device includes the sensor described in one of the above, and a circuit controller configured to control a circuit based on a signal obtained from the sensor.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIGS. 1A, 1B, 2A, 2B and 3 are schematic views illustrating a sensor according to a first embodiment.

Figure 1B:
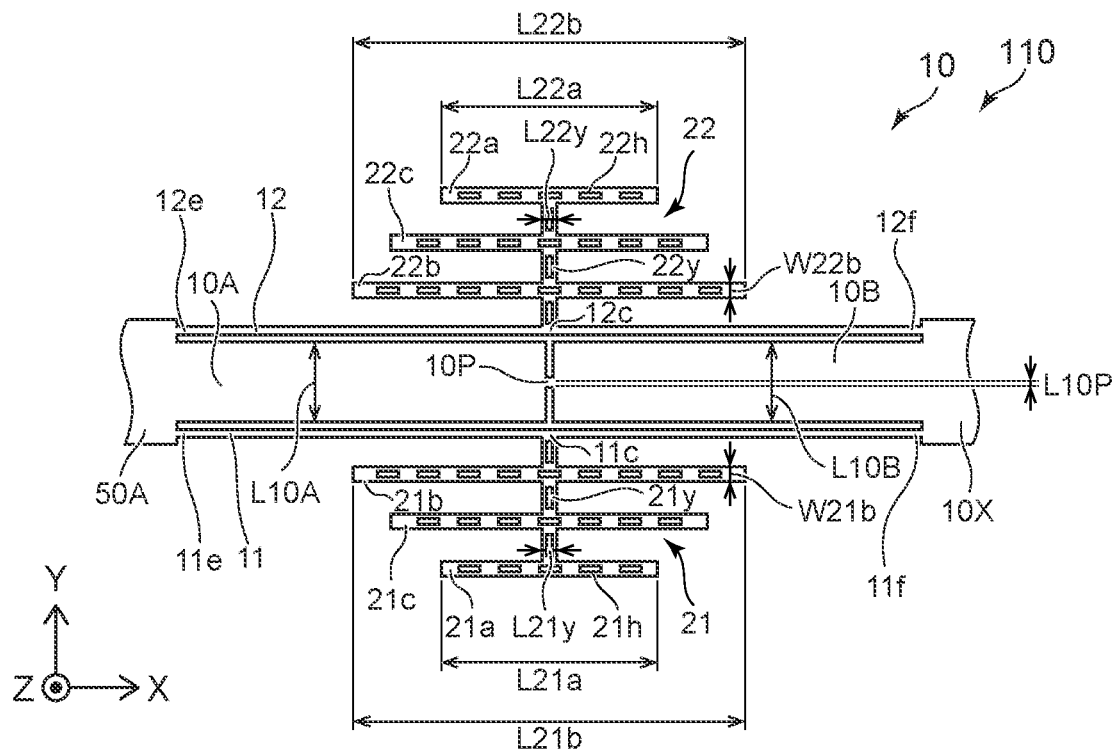

FIGS. 1A, 1B, 2A and 3 are plan views. FIGS. 1A and 1B are illustrated by enlarging a part of FIG. 2A. FIG. 2B is a cross-sectional view taken along the line X1-X2 of FIG. 2A.

Figure 2A:
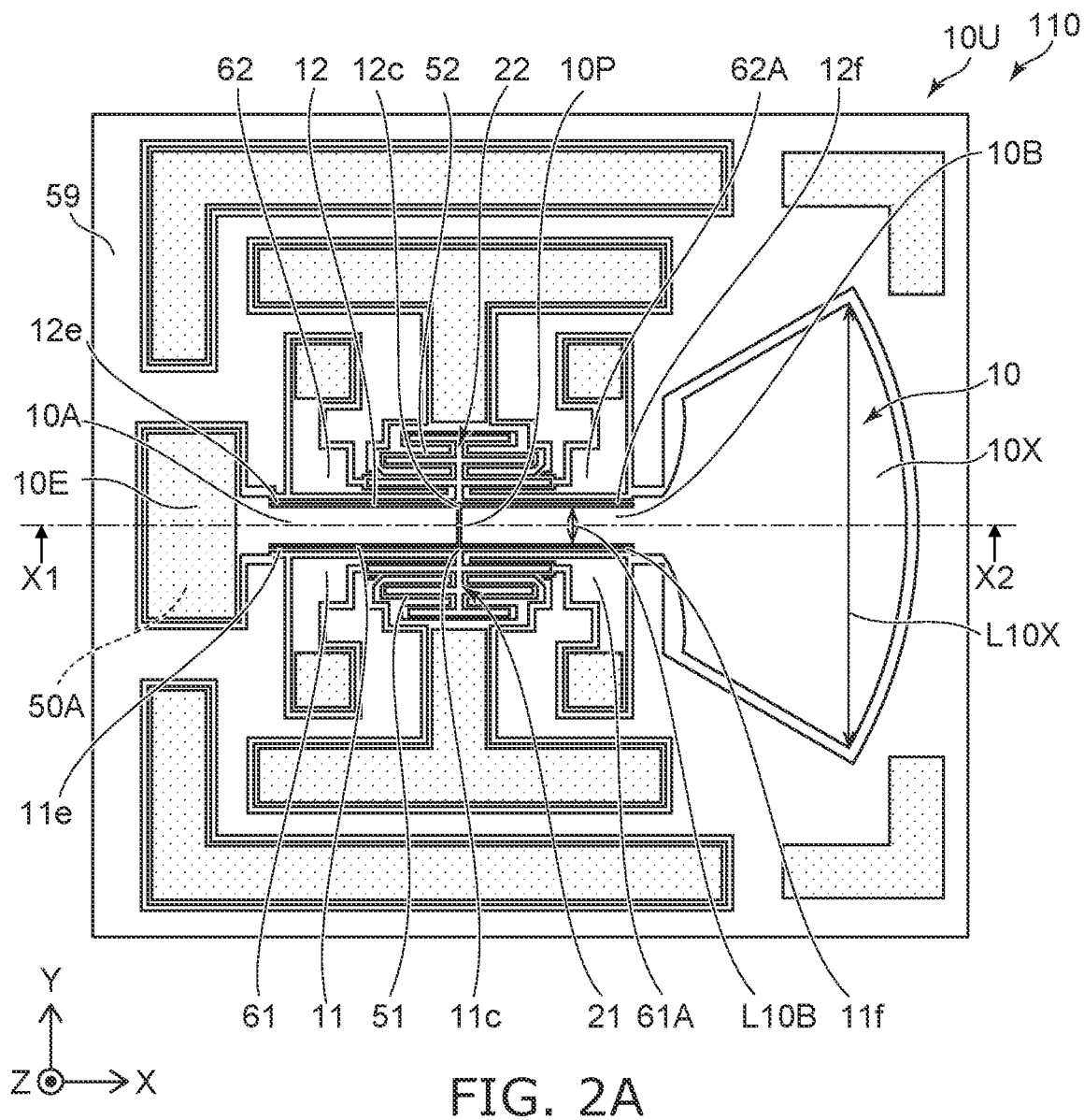
FIGS. 2A and 2B are schematic views illustrating the sensor according to the first embodiment.
Figure 2B:
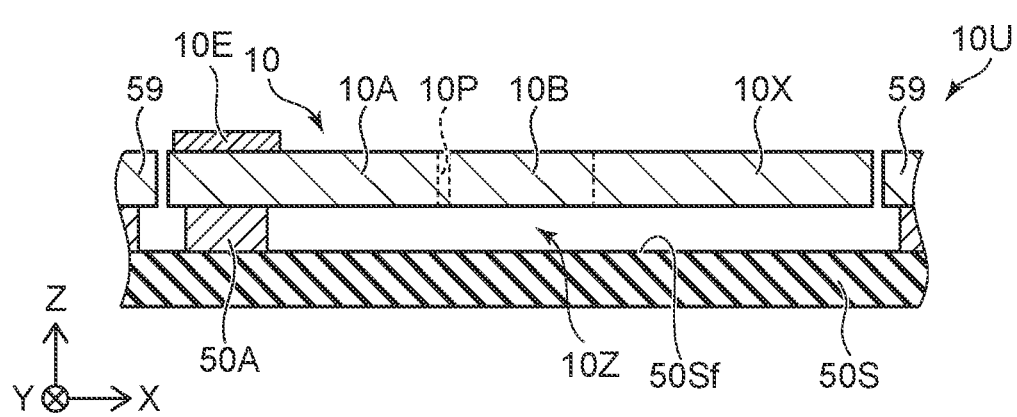

As shown in FIGS. 2A and 2B, a sensor 110 according to the embodiment includes a base 50S, a first support portion 50A, and a first movable portion 10. For example, the first support portion 50A and the first movable portion 10 may be included in the first detection element 10U. The first detection element 10U may include a base 50S.

The first support portion 50A is fixed to the base 50S. The first support portion 50A is provided on a first surface 50Sf of the base 50S. The first movable portion 10 is supported by the first support portion 50A. The first movable portion 10 is separated from the base 50S.

A first direction from the base 50S to the first movable portion 10 is a Z-axis direction. One direction perpendicular to the Z-axis direction is defined as an X-axis direction. The direction perpendicular to the Z-axis direction and the X-axis direction is defined as a Y-axis direction.

The first movable portion 10 includes a first movable base portion 10A, a second movable base portion 10B, a connecting base portion 10P, a first movable beam 11, a second movable beam 12, a first movable conductive portion 21, and a second movable conductive portion 22. The first movable base portion 10A is supported by the first support portion 50A. A second direction from the first movable base portion 10A to the second movable base portion 10B crosses the first direction (Z-axis direction) from the base 50S to the first movable portion 10. The second direction is, for example, the X-axis direction.

The connecting base portion 10P is provided between the first movable base portion 10A and the second movable base portion 10B. The connecting base portion 10P connects the second movable base portion 10B to the first movable base portion 10A.

As shown in FIGS. 1A and 1B, the first movable beam 11 includes a first beam end portion 11e, a first beam other end portion 11f, and a first beam intermediate portion 11c. The first beam end portion 11e is connected with the first movable base portion 10A. The first beam other end portion 11f is connected with the second movable base portion 10B. The first beam intermediate portion 11c is located between the first beam end portion 11e and the first beam other end portion 11f. The first movable beam 11 extends along the second direction (X-axis direction).

The second movable beam 12 includes a second beam end portion 12e, a second beam other end portion 12f, and a second beam intermediate portion 12c. The second beam end portion 12e is connected with the first movable base portion 10A. The second beam other end portion 12f of is connected with the second movable base portion 10B. The second beam intermediate portion 12c is located between the second beam end portion 12e and the second beam other end portion 12f. The second movable beam 12 extends along the second direction (X-axis direction). In a third direction crossing a plane including the first direction and the second direction, the connecting base portion 10P is located between the first beam intermediate portion 11c and the second beam intermediate portion 12c. The third direction is, for example, the Y-axis direction.

As shown in FIGS. 1A and 1B, the first movable conductive portion 21 is connected with the first beam intermediate portion 11c. The first beam intermediate portion 11c is located between the first movable conductive portion 21 and the connecting base portion 10P in the third direction (Y-axis direction).

The first movable conductive portion 21 includes a first crossing conductive portion 21y, a first extending conductive portion 21a, and a first other extending conductive portion 21b. The first crossing conductive portion 21y is connected with the first beam intermediate portion 11c and extends along the third direction (Y-axis direction). The first extending conductive portion 21a is connected with the first crossing conductive portion 21y and extends along the second direction (X-axis direction). For example, a central portion of the first extending conductive portion 21a is connected with the first crossing conductive portion 21y.

The first other extending conductive portion 21b is connected with the first crossing conductive portion 21y and extends along the second direction (X-axis direction). For example, a central portion of the first other extending conductive portion 21b is connected with the first crossing conductive portion 21y. The first other extending conductive portion 21b is located between the first extending conductive portion 21a and the first beam intermediate portion 11c in the third direction (Y-axis direction).

As shown in FIGS. 1A and 1B, the second movable conductive portion 22 is connected with the second beam intermediate portion 12c. The second beam intermediate portion 12c is located between the connecting base portion 10P and the second movable conductive portion 22 in the third direction (Y-axis direction).

The second movable conductive portion 22 includes a second crossing conductive portion 22y, a second extending conductive portion 22a, and a second other extending conductive portion 22b. The second crossing conductive portion 22y is connected with the second beam intermediate portion 12c and extends along the third direction (Y-axis direction). The second extending conductive portion 22a is connected with the second crossing conductive portion 22y and extends along the second direction (X-axis direction). For example, a central portion of the second extending conductive portion 22a is connected with the second crossing conductive portion 22y.

The second other extending conductive portion 22b is connected with the second crossing conductive portion 21y and extends along the second direction (X-axis direction). For example, a central portion of the second other extending conductive portion 22b is connected with the second crossing conductive portion 22y. The second other extending conductive portion 22b is located between the second beam intermediate portion 12c and the second extending conductive portion 22a in the third direction (Y-axis direction).

For example, when acceleration is applied to the sensor 110, one of compressive stress or tensile stress is generated in the first movable beam 11. On the other hand, in the second movable beam 12, other of the compressive stress and tensile stress is generated. As a result, a difference is generated between the resonance frequency of the first movable beam 11 and the resonance frequency of the second movable beam 12. For example, acceleration can be detected by detecting the difference in resonance frequency (and its change).

Figure 3:
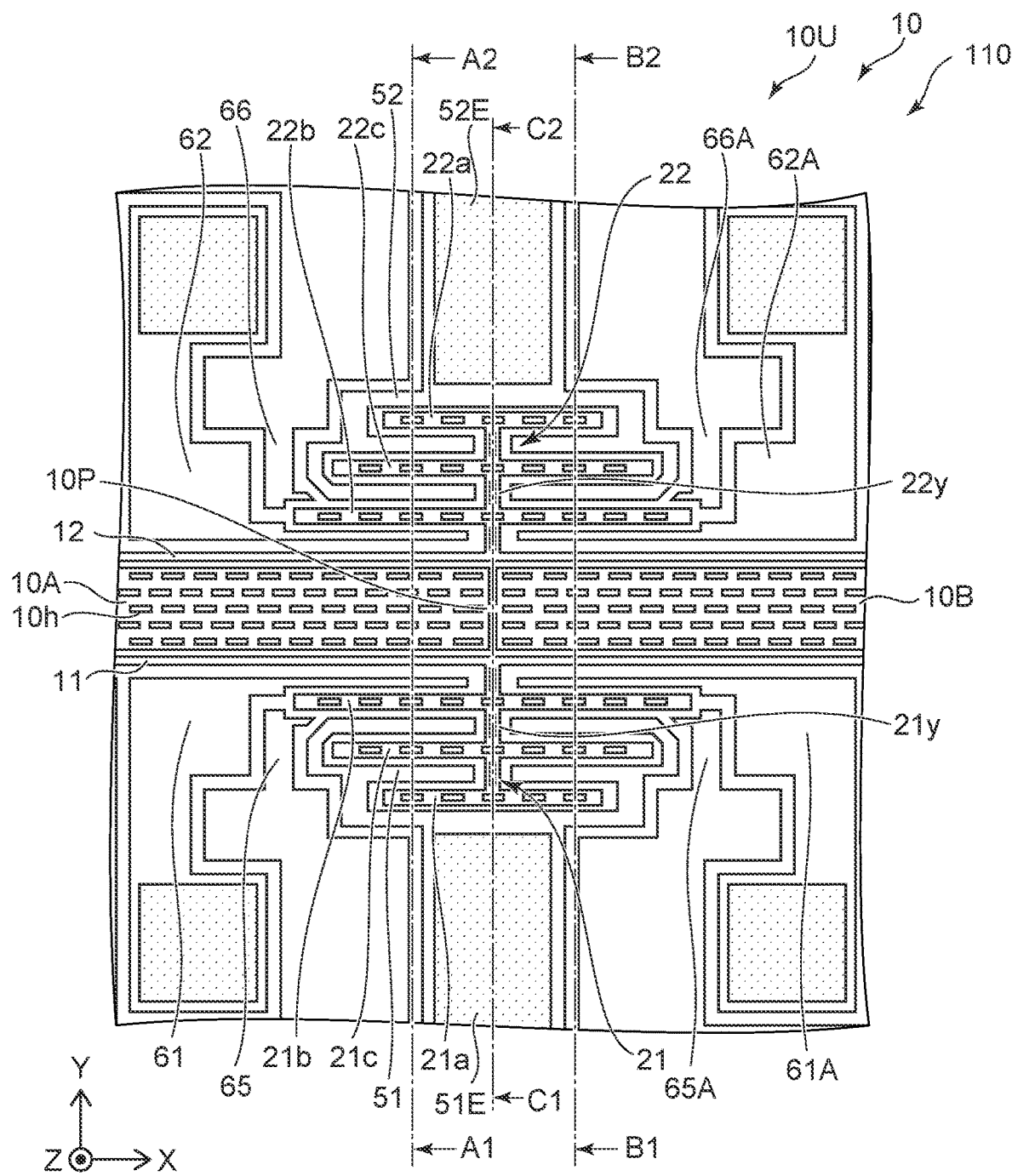
FIG. 3 is a schematic view illustrating the sensor according to the first embodiment.

As shown in FIG. 3, for example, the sensor 110 includes a first facing conductive portion 51 and a second facing conductive portion 52. The first facing conductive portion 51 faces at least a part of the first movable conductive portion 21 in the third direction (for example, the Y-axis direction). The second facing conductive portion 52 faces at least a part of the second movable conductive portion 22 in the third direction (for example, the Y-axis direction). For example, a capacitance changes in accordance with a change (displacement) in the distance between the first facing conductive portion 51 and the first movable conductive portion 21. By detecting the change in capacitance, a vibration state of the first movable conductive portion 21 (and the first movable beam 11) can be detected. For example, the capacitance changes in accordance with a change (displacement) in the distance between the second facing conductive portion 52 and the second movable conductive portion 22. By detecting the change in capacitance, a vibration state of the second movable conductive portion 22 (and the second movable beam 12) can be detected.

In the embodiment, the first movable conductive portion 21 includes the first extending conductive portion 21a and the first other extending conductive portion 21b. The first extending conductive portion 21a and the first other extending conductive portion 21b face the first facing conductive portion 51. As a result, the area of the region where the first movable conductive portion 21 and the first facing conductive portion 51 face each other increases as compared with the case where the first movable conductive portion 21 includes one extending conductive portion. As a result, the change in capacitance with respect to the displacement can be increased. According to the embodiment, high sensitivity can be obtained. It is possible to provide a sensor whose characteristics can be improved.

In the same way, the second extending conductive portion 22a and the second other extending conductive portion 22b face the second facing conductive portion 52. As a result, the area of the region where the second movable conductive portion 22 and the second facing conductive portion 52 face each other increases as compared with the case where the second movable conductive portion 22 includes one extending conductive portion. As a result, the change in capacitance with respect to the displacement can be increased. According to the embodiment, high sensitivity can be obtained. It is possible to provide a sensor whose characteristics can be improved.

As shown in FIG. 3, the sensor 110 may include a first facing electrode 61 and a second facing electrode 62. The first facing electrode 61 faces at least a part of the first movable conductive portion 21 in the third direction (for example, the Y-axis direction). The second facing electrode 62 faces at least a part of the second movable conductive portion 22 in the third direction (for example, the Y-axis direction).

For example, an electric signal (for example, an AC signal) is supplied to the first facing electrode 61. As a result, the first movable conductive portion 21 is displaced and the first movable beam 11 vibrates. An electric signal (for example, an AC signal) is supplied to the second facing electrode 62. As a result, the second movable conductive portion 22 is displaced and the second movable beam 12 vibrates. When no stress is applied to the movable beams, the movable beams can vibrate at the designed resonance frequency.

The first movable beam 11 and the second movable beam 12 vibrate via the first movable conductive portion 21 and the second movable conductive portion 22 based on the AC signal supplied to the facing electrode. As described above, the vibration state of the first movable beam 11 and the second movable beam 12 can be detected via the first facing conductive portion 51, the second facing conductive portion 52, the first movable conductive portion 21, and the second movable conductive portion 22. From the vibration state, a value corresponding to the difference (or change) in the resonance frequency between the first movable beam 11 and the second movable beam 12 can be obtained.

As shown in FIG. 2, the first movable portion 10 may further include a movable member 10X. In the second direction (X-axis direction), the second movable base portion 10B is provided between the first movable base portion 10A and the movable member 10X. A length L10X of the movable member 10X along the third direction (Y-axis direction) is longer than a length L10B of the second movable base portion 10B along the third direction. A mass of the movable member 10X is larger than a mass of the second movable base portion 10B.

In such a configuration, when acceleration is applied to the first movable portion 10, the movable member 10X is largely displaced. In accordance with this, the second movable base portion 10B is largely displaced. For example, the second movable base portion 10B is displaced in the circumferential direction about the Z-axis direction with the connecting base portion 10P as the center. As a result, a larger stress can be applied to the first movable beam 11 and the second movable beam 12.

As shown in FIG. 1B, in one example, a length L21b along the second direction (X-axis direction) of the first other extending conductive portion 21b is longer than a length L21a along of the second direction (X-axis direction) of the first extending conductive portion 21a. A length L22b of the second other extending conductive portion 22b along the second direction (X-axis direction) is longer than a length L22a of the second extending conductive portion 22a along the second direction (X-axis direction).

As described above, the length of the extending conductive portion far from the first beam intermediate portion 11c is shorter than the length of the extending conductive portion close to the first beam intermediate portion 11c. The length of the extending conductive portion far from the second beam intermediate portion 12c is shorter than the length of the extending conductive portion close to the second beam intermediate portion 12c. Due to the above-mentioned length of the extending conductive portion, for example, the distance between the extending conductive portion and the facing conductive portion can be easily controlled more appropriately. For example, it is possible to more effectively suppress the extending conductive portion being into contact with the facing conductive portion or the like.

For example, the length L21b of the first other extending conductive portion 21b along the second direction is not less than 1.2 times the length L21a of the first extending conductive portion 21a along the second direction. The length L22b of the second other extending conductive portion 22b along the second direction is not less than 1.2 times the length L22a of the second extending conductive portion 22a along the second direction.

As shown in FIG. 3, at least a part of the first facing conductive portion 51 is between the first other extending conductive portion 21b and the first extending conductive portion 21a in the third direction (for example, the Y-axis direction). At least a part of the second facing conductive portion 52 is between the second other extending conductive portion 22b and the second extending conductive portion 22a in the third direction (for example, the Y-axis direction). The area of the region where the first facing conductive portion 51 and the first movable conductive portion 21 face each other can be increased. The area of the region where the second facing conductive portion 52 and the second movable conductive portion 22 face each other can be increased.

As shown in FIG. 1B, a length of the first other extending conductive portion 21b along the third direction (Y-axis direction) is defined as a length W21b. The length L21b of the first other extending conductive portion 21b along the second direction (X-axis direction) is longer than the length W21b. A length of the second other extending conductive portion 22b along the third direction is defined as a length W22b. The length L22b of the second other extending conductive portion 22b along the second direction (X-axis direction) is longer than the length W22b.

A length of the first crossing conductive portion 21y along the second direction (X-axis direction) is defined as a length L21y. The length L21a of the first extending conductive portion 21a along the second direction (X-axis direction) is longer than the length L21y. A length of the second crossing conductive portion 22y along the second direction (X-axis direction) is defined as a length L22y. The length L22a of the second extending conductive portion 22a along the second direction (X-axis direction) is longer than the length L22y.

As shown in FIG. 1B, a length L10A of the first movable base portion 10A along the third direction (Y-axis direction) is longer than a length L10P of the connecting base portion 10P along the third direction. A length L10B of the second movable base portion 10B along the third direction is longer than the length L10P of the connecting base portion 10P along the third direction. Due to the small connecting base portion 10P, for example, the second movable base portion 10B is more easily displaced. It is easy to obtain higher sensitivity.

As shown in FIGS. 2A and 2B, a structure body 59 may be provided around the first movable portion 10.

As shown in FIG. 2B, the first support portion 50A is provided on the base 50S. The first movable base portion 10A is supported by the first support portion 50A. An electrode 10E is provided on the first movable base portion 10A.

As shown in FIG. 3, the sensor 110 may include a first structure body 65 and a second structure body 66. In this example, an other first structure body 65A and an other second structure body 66A are provided. These structure bodies are fixed to the base 50S (see FIG. 1B). As shown in FIG. 3, at least a part of the first structure body 65 (and the other first structure body 65A) faces at least a part of the first movable conductive portion 21 in the third direction (for example, the Y-axis direction). At least a part of the second structure body 66 (and the other second structure body 66A) faces at least a part of the second movable conductive portion 22 in the third direction (for example, the Y-axis direction). These structure bodies may function, for example, as stoppers. With these structure bodies, it is possible to suppress the first movable conductive portion 21 and the second movable conductive portion 22 being excessively displaced. For example, damage to the first movable portion 10 can be suppressed.

Figure 4A:
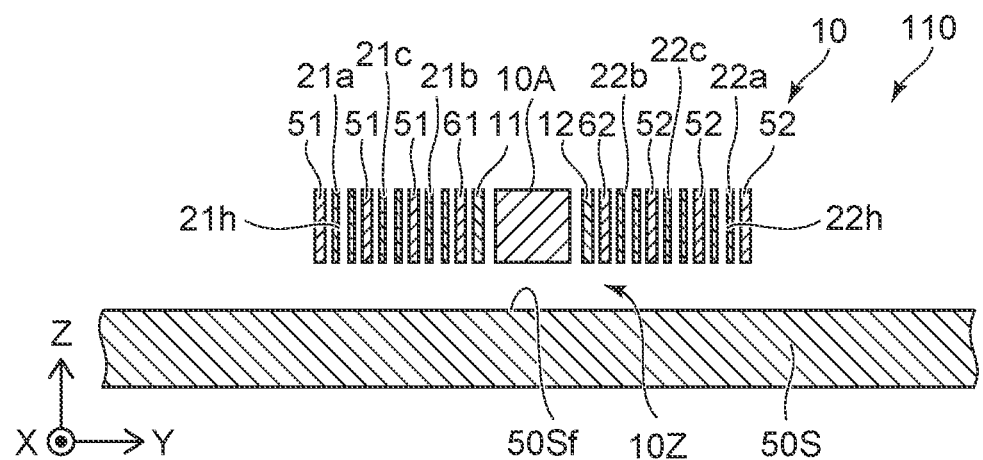
FIGS. 4A to 4C are schematic cross-sectional views illustrating the sensor according to the first embodiment.
Figure 4B:
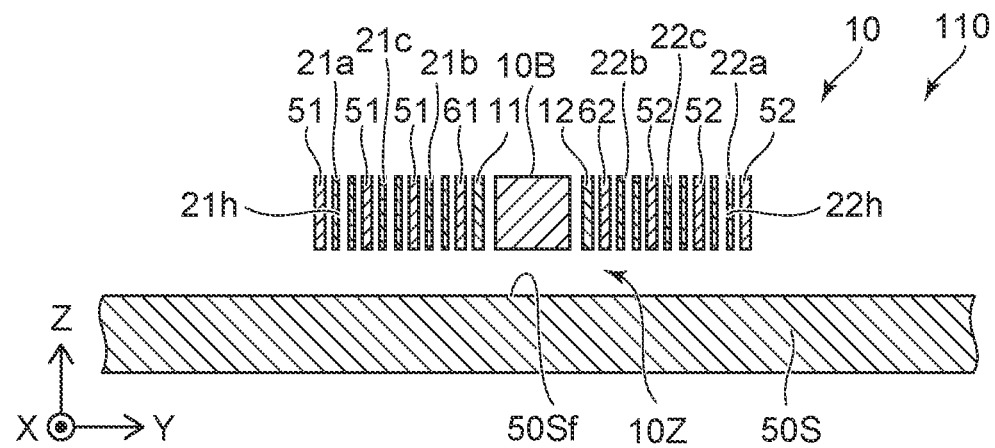
Figure 4C:
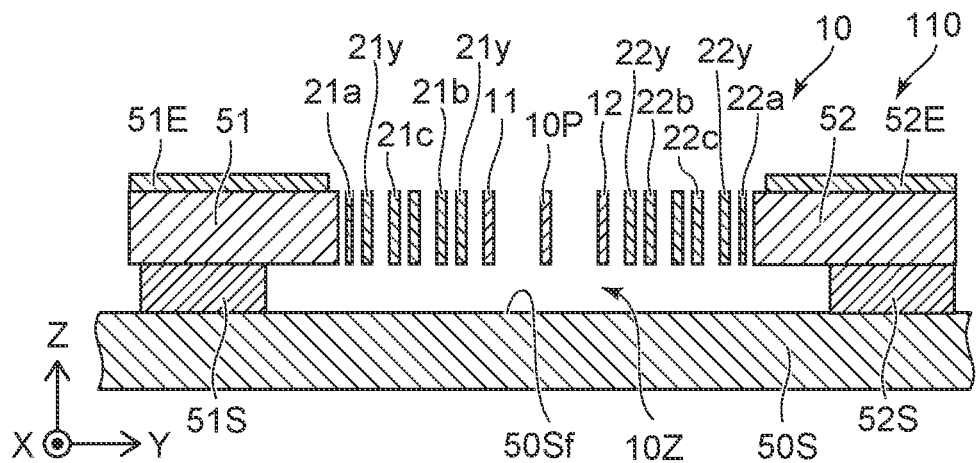

FIGS. 4A to 4C are schematic cross-sectional views illustrating the sensor according to the first embodiment.

FIG. 4A is a cross-sectional view taken along the line A1-A2 of FIG. 3. FIG. 4B is a cross-sectional view taken along the line B1-B2 of FIG. 3. FIG. 4C is a cross-sectional view taken along the line C1-C2 of FIG. 3.

As shown in FIGS. 4A to 4C, a gap 10Z is provided between the base 50S and the first movable portion 10.

As shown in FIG. 4C, the first facing conductive portion 51 is provided on the support portion 51S provided on the base 50S. An electrode 51E is provided on the first facing conductive portion 51. The second facing conductive portion 52 is provided on the support portion 52S provided on the base 50S. An electrode 52E is provided on the second facing conductive portion 52. For example, electrical characteristics (e.g., change in capacitance) between the electrode 51E and the electrode 10E (see FIG. 2B) are detected. For example, electrical characteristics (e.g., change in capacitance) between the electrode 52E and the electrode 10E are detected.

Figure 5:
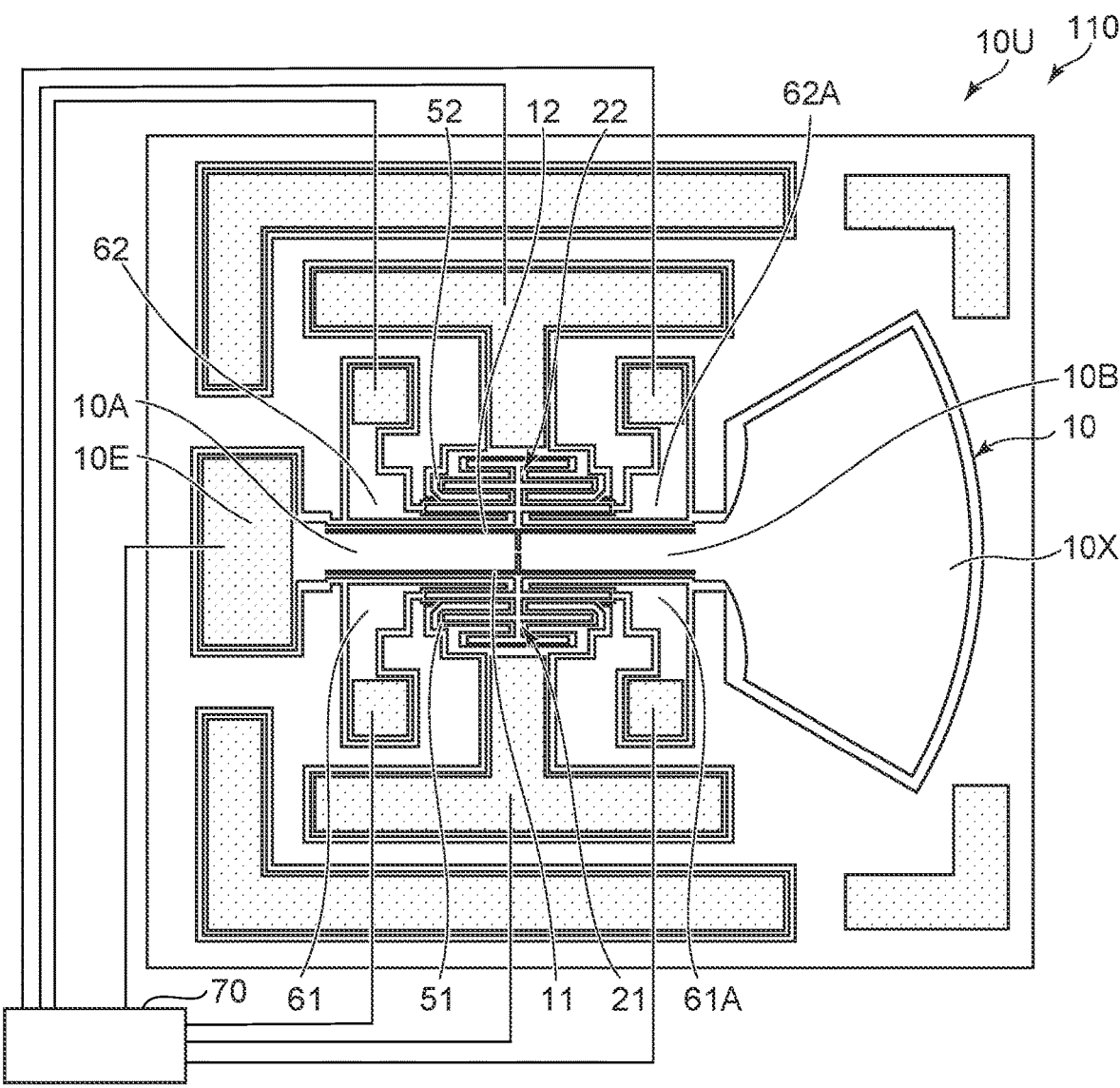
FIG. 5 is a schematic view illustrating the sensor according to the first embodiment.

FIG. 5 is a schematic diagram illustrating the sensor according to the first embodiment.

As shown in FIG. 5, the sensor 110 may include a controller 70. The controller 70 is electrically connected with the first movable portion 10, the first facing conductive portion 51, the second facing conductive portion 52, the first facing electrode 61, and the second facing electrode 62. The controller 70 applies, for example, an AC signal (for example, a drive signal) between the first movable unit 10 and the facing electrode. The controller 70 detects, for example, the electrical characteristics between the first movable unit 10 and the facing conductive unit.

As shown in FIG. 5, the sensor 110 may include the first facing electrode 61 and another first facing electrode 61A.

The sensor 110 may include the second counter electrode 62 and another second facing electrode 62A.

As shown in FIGS. 1B, 3, 4A and 4B, in the sensor 110, the first movable conductive portion 21 may include one or a plurality of first holes 21h. At least one of the first crossing conductive portion 21y, the first extending conductive portion 21a, or the first other extending conductive portion 21b may include one or a plurality of first holes 21h. The second movable conductive portion 22 may include one or a plurality of second holes 22h. At least one of the second crossing conductive portion 22y, the second extending conductive portion 22a, or the second other extending conductive portion 22b may include one or a plurality of second holes 21h. The masses of the first movable conductive portion 21 and the second movable conductive portion 22 may be adjusted by the holes.

As shown in FIG. 3, the first movable base portion 10A and the second movable base portion 10B may include a hole 10h. In FIGS. 4A and 4B, the holes 10h of the first movable base portion 10A and the second movable base portion 10B are omitted. The movable member 10X may include the hole 10h.

As shown in FIG. 1B, the first movable conductive portion 21 may further include a first intermediate extending conductive portion 21c. The first intermediate extending conductive portion 21c is connected with the first crossing conductive portion 21y and extends along the second direction (for example, the X-axis direction). The first intermediate extending conductive portion 21c is located between the first extending conductive portion 21a and the first other extending conductive portion 21b in the third direction (for example, the Y-axis direction). The length of the first intermediate extending conductive portion 21c along the second direction is between the length L21a of the first extending conductive portion 21a along the second direction and the length L21b of the first other extending conductive portion 21b along the second direction. For example, a central portion of the first intermediate extending conductive portion 21c is connected with the first crossing conductive portion 21y.

As shown in FIG. 1B, the second movable conductive portion 22 may further include a second intermediate extending conductive portion 22c. The second intermediate extending conductive portion 22c is connected with the second crossing conductive portion 22y and extends along the second direction (for example, the X-axis direction). The second intermediate extending conductive portion 22c is located between the second other extending conductive portion 22b and the second extending conductive portion 22a in the third direction (for example, the Y-axis direction). The length of the second intermediate extending conductive portion 22c along the second direction is between the length L22b of the second other extending conductive portion 22b along the second direction and the length L22a of the second extending conductive portion 22a along the second direction. For example, a central portion of the second intermediate extending conductive portion 22c is connected with the second crossing conductive portion 22y.

Figure 6:
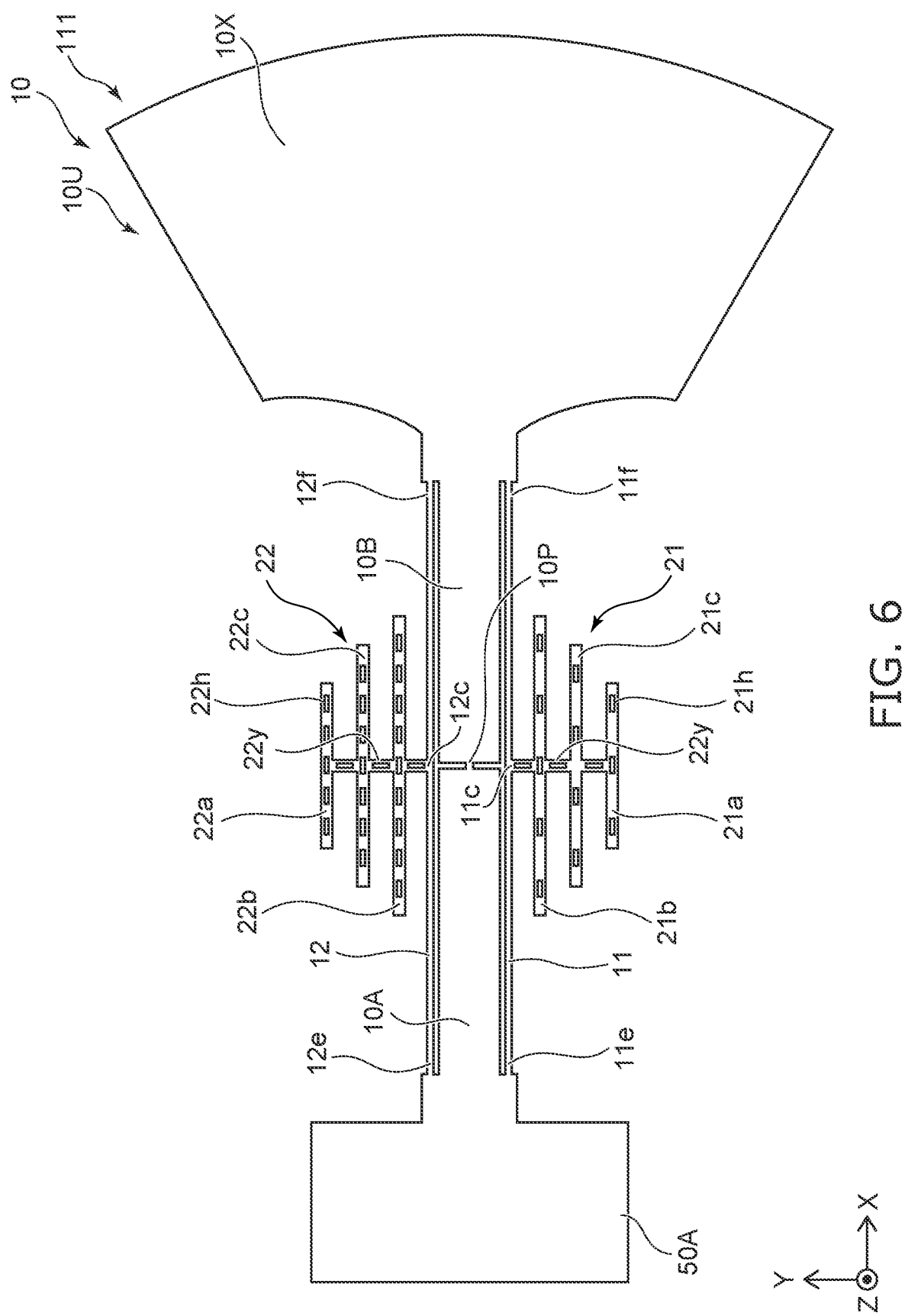
FIG. 6 is a schematic diagram illustrating a sensor according to the first embodiment.

FIG. 6 is a schematic diagram illustrating a sensor according to the first embodiment.

As shown in FIG. 6, a sensor 111 according to the embodiment includes the first movable portion 10. The first movable portion 10 includes the first movable conductive portion 21 and the second movable conductive portion 22. In the sensor 111, the configuration of the second movable conductive portion 22 is different from the configuration of the first movable conductive portion 21. Other configurations of the sensor 111 may be the same as the configuration of the sensor 110. For example, the first movable conductive portion 21 is connected with the first movable beam 11. The second movable conductive portion 22 is connected with the second movable beam 12.

In this example, in the sensor 111, the first movable conductive portion 21 includes the plurality of first holes 21h. The second movable conductive portion 22 includes the plurality of second holes 22h. The number of the plurality of second holes 22h is different from the number of the plurality of first holes 21h. For example, the mass of the second movable conductive portion 22 is different from the mass of the first movable conductive portion 21. For example, the second movable conductive portion 22 is asymmetric with respect to the first movable conductive portion 21.

As a result, the difference in resonance frequency between the first movable beam 11 and the second movable beam 12 can be increased as compared with the case where the masses of these movable conductive portions are the same. By the difference in resonance frequency being large, the acceleration detection range (dynamic range) can be expanded. For example, a wide dynamic range can be obtained while maintaining high accuracy. A sensor that can improve the characteristics can be provided.

In one example according to the embodiment, the first movable conductive portion 21 may include the first hole 21h, and the second movable conductive portion 22 may not include the hole 22h.

In another example, the first movable conductive portion 21 includes the first hole 21h, and the second movable conductive portion 22 includes the second hole 22h. The area of the second hole 22h in the plane (X-Y plane) including the second direction and the third direction may be different from the area of the first hole 21h in the plane (X-Y plane).

For example, the first movable conductive portion 21 includes the plurality of first holes 21h, and the second movable conductive portion 22 includes the plurality of second holes 22h. The sum of the areas of the plurality of second holes 22h in the plane (X-Y plane) including the second direction and the third direction may be different from the sum of the areas of the plurality of first holes 21h in the plane (X-Y plane).

As mentioned above, the difference in mass can be obtained by the difference in holes. For example, an outer shape of the second movable conductive portion 22 in the X-Y plane is substantially the same as an outer shape of the first movable conductive portion 21 in the X-Y plane. As a result, the temperature characteristics of these movable conductive portions become substantially the same. Since the outer shape is substantially the same and the holes are different, a difference in mass can be obtained while suppressing an adverse effect on the temperature characteristics. For example, a wide dynamic range can be obtained while keeping the temperature coefficient of frequency substantially constant.

Second Embodiment

Figure 7:
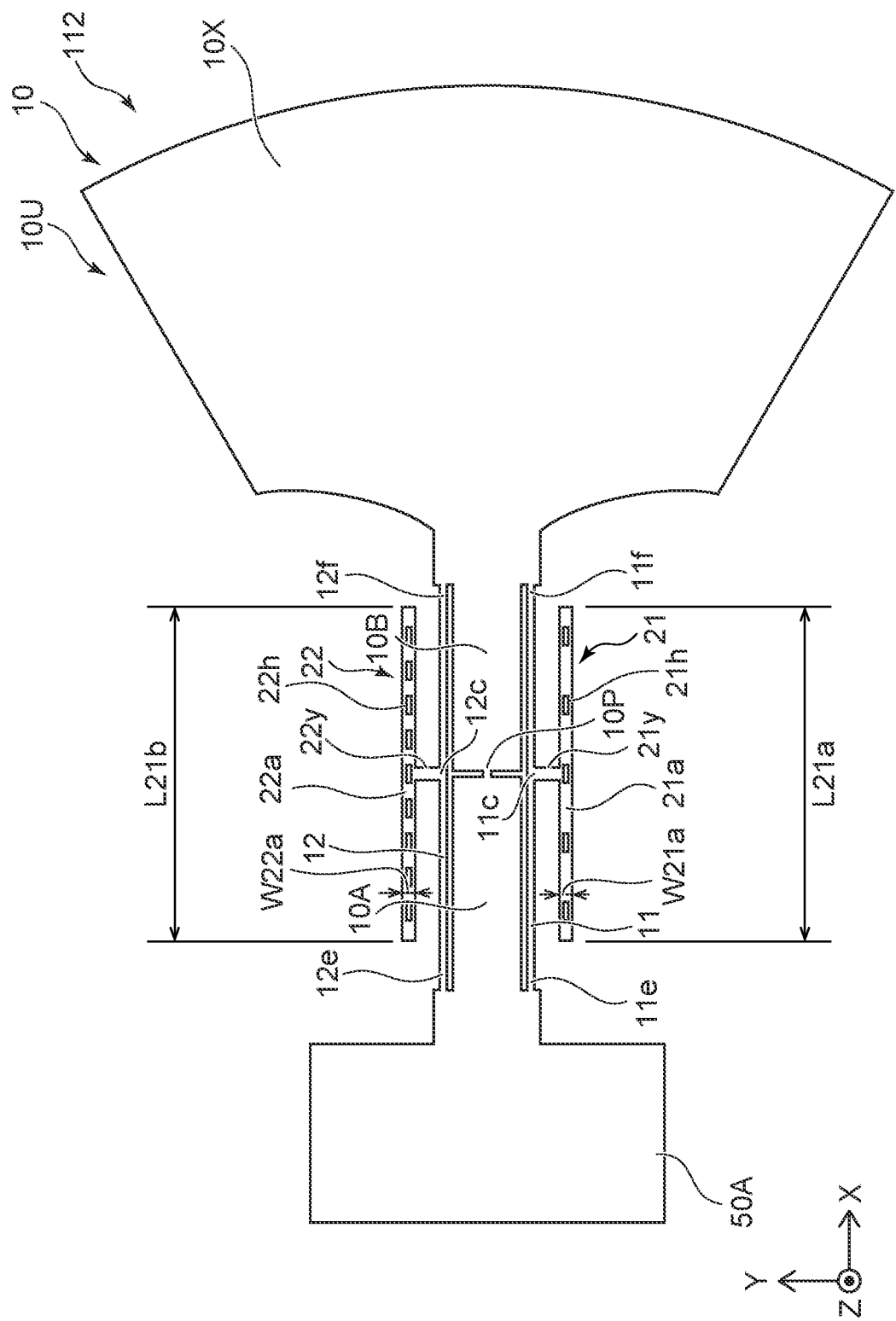
FIG. 7 is a schematic diagram illustrating a sensor according to a second embodiment.

FIG. 7 is a schematic diagram illustrating a sensor according to a second embodiment.

As shown in FIG. 7, a sensor 112 according to the embodiment includes the first movable portion 10. The first movable portion 10 includes the first movable conductive portion 21 and the second movable conductive portion 22. In the sensor 112, the configuration of the second movable conductive portion 22 is different from the configuration of the first movable conductive portion 21. Other configurations of the sensor 112 may be the same as the configuration of the sensor 110.

For example, the sensor 112 includes the base 50S and the first support portion 50A (see FIG. 2B and the like). Also, the sensor 112, the first movable portion 10 includes the first movable base portion 10A, the second movable base portion 10B, the connecting base portion 10P, the first movable beam 11, the second movable beam 12, the first movable conductive portion 21, and the second movable conductive portion 22. The configurations of the first movable base portion 10A, the second movable base portion 10B, the connecting base portion 10P, the first movable beam 11 and the second movable beam 12 in the sensor 112 may be the same as those in the sensor 110.

In the sensor 112, the first beam intermediate portion 11c of the first movable beam 11 is located between the connecting base portion 10P and the first movable conductive portion 21 in the third direction (Y-axis direction). The first movable conductive portion 21 includes the first extending conductive portion 21a extending along the second direction (X-axis direction). The first extending conductive portion 21a is connected with the first beam intermediate portion 11c by, for example, the first crossing conductive portion 21y extending along the third direction (Y-axis direction).

In the sensor 112, the second beam intermediate portion 12c of the second movable beam 12 is located between the connecting base portion 10P and the second movable conductive portion 22 in the third direction (Y-axis direction). The second movable conductive portion 22 includes the second extending conductive portion 22a extending along the second direction (X-axis direction). The second extending conductive portion 22a is connected with the second beam intermediate portion 12c by, for example, the second crossing conductive portion 22y extending along the third direction (Y-axis direction).

In the sensor 112, for example, the mass of the second movable conductive portion 22 is different from the mass of the first movable conductive portion 21.

For example, the first movable conductive portion 21 includes one or the plurality of first holes 21h. The second movable conductive portion 22 includes one or the plurality of second holes 22h. The sum of the areas of the one or more second holes 22h in the plane (X-Y plane) including the second direction and the third direction is different from the sum of the areas of the one or more first holes 21h in the plane.

As a result, the difference in resonance frequency between the first movable beam 11 and the second movable beam 12 can be increased as compared with the case where the masses of these movable conductive portions are the same. Since the difference in resonance frequency is large, the acceleration detection range (dynamic range) can be expanded. For example, a wide dynamic range can be obtained while maintaining high accuracy. A sensor that can improve the characteristics can be provided.

For example, the first movable conductive portion 21 includes the plurality of the first holes 21h. The second movable conductive portion 22 includes the plurality of second holes 22h. The number of the plurality of second holes 22h is different from the number of the plurality of first holes 21h.

In the sensor 112, for example, the outer shape of the second movable conductive portion 22 in the X-Y plane may be substantially the same as the outer shape of the first movable conductive portion 21 in the X-Y plane. As a result, the temperature characteristics of the movable conductive portions become substantially the same. Since the outer shape is substantially the same and the holes are different, the difference in mass can be obtained while suppressing an adverse effect on the temperature characteristics. For example, a wide dynamic range can be obtained while keeping the temperature coefficient of frequency substantially constant.

The embodiment can be applied to, for example, a DRA (Differential Resonant Accelerometer). It is desired to expand the dynamic range of the sensor. In general, it is difficult for a sensor to achieve both high accuracy and a wide dynamic range, for example.

In one example of the embodiments, a plurality of extending conductive portions are provided. Thereby, a "Tree type electrode" is formed. The plurality of extending conductive portions are connected with a plurality of movable beams (two resonant beams). As a result, high capacitance sensitivity can be obtained. For example, it is easy to reduce phase noise of the PLL circuit. For example, high accuracy (for example, low drift) becomes easy.

For example, the mass of the second movable conductive portion 22 is different from the mass of the first movable conductive portion 21. Due to the asymmetric mass, for example, the difference in frequency between the two resonant beams can be increased. As a result, a wide dynamic range can be obtained. For example, a ratio of the frequency difference to the scale factor can be increased. At this time, for example, it is preferable that the anchoring position and shape are the same between the two movable conductive portions. As a result, the temperature coefficient of the resonance frequency of the two resonance beams is maintained substantially the same. For example, higher temperature stability can be obtained by a differential processing.

Third Embodiment

Figure 8A:
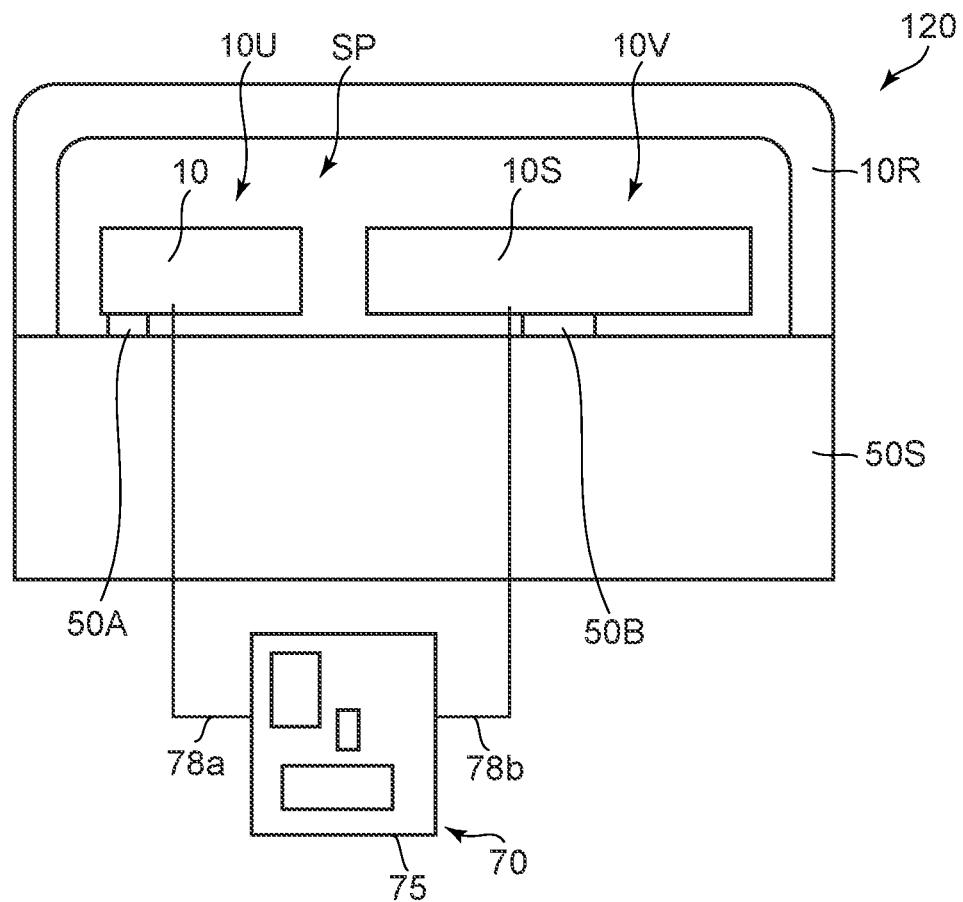
FIGS. 8A and 8B are schematic cross-sectional views illustrating a sensor according to a third embodiment.
Figure 8B:
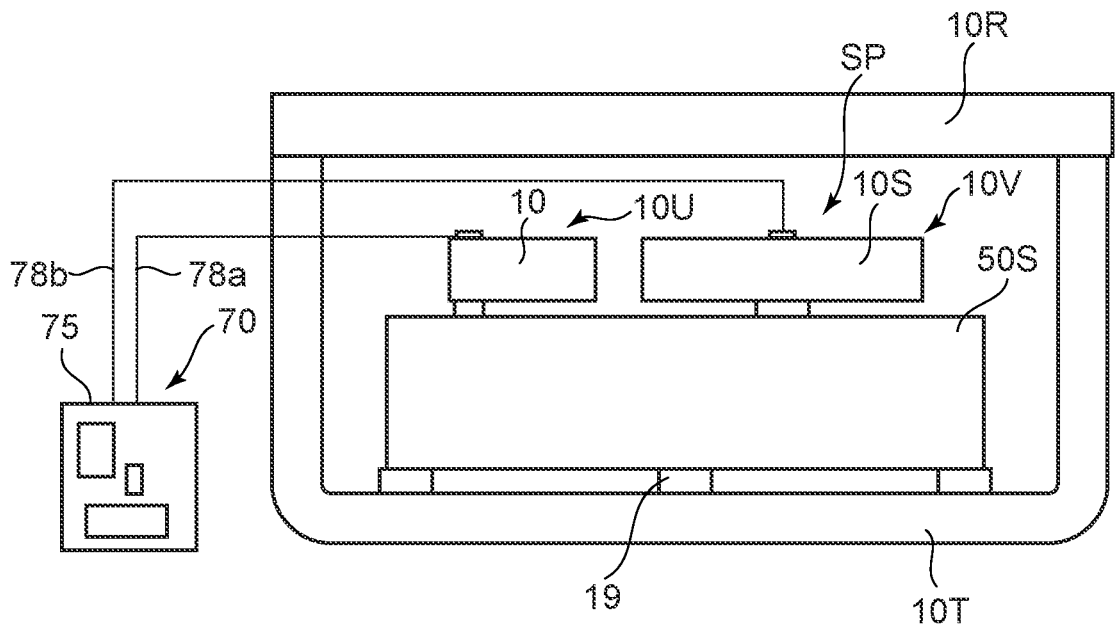

FIGS. 8A and 8B are schematic cross-sectional views illustrating a sensor according to the third embodiment.

As shown in FIG. 8A, a sensor 120 according to the embodiment includes a second detection element 10V in addition to the first detection element 10U described with respect to the first embodiment or the second embodiment. The second detection element 10V includes, for example, a second support portion 50B and a second movable portion 10S. The second support portion 50B is fixed to the base 50S. The second movable portion 10S is supported by the second support portion 50B and is separated from the base 50S. The sensor 120 can detect an angle of the sensor 120 by a signal corresponding to the movement of the second movable portion 10S. For example, at least a part of the second movable portion 10S is vibrated. The angle can be detected by detecting the vibration state that changes according to the change in the angle. For example, angle detection is performed based on the Foucault pendulum principle. The second movable portion 10S is, for example, an angle direct detection type gyro (RIG: Rate Integrating Gyroscope). The sensor 120 is, for example, an inertial measurement unit (IMU).

In the sensor 120, the configurations described with respect to the first embodiment or the second embodiment can be applied to the configurations of the base 50S, the first support portion 50A, the first movable portion 10, and the like.

As shown in FIG. 8A, the sensor 120 may be provided with a lid portion 10R. The lid portion 10R is connected with the base 50S. The first support portion 50A, the first movable portion 10, the second support portion 50B, and the second movable portion 10S are provided between the base 50S and the lid portion 10R. For example, a space SP surrounded by the base 50S and the lid portion 10R is less than 1 atm. By reducing the pressure in the space SP, more accurate detection can be performed. The space SP is, for example, not more than 0.1 Pa.

As shown in FIGS. 8A and 8B, the electric signal obtained from the first movable portion 10 and the electric signal obtained from the second movable portion 10S may be supplied to a processing circuit 75. For example, the first movable portion 10 and the processing circuit 75 are electrically connected by the wiring 78a. The second movable portion 10S and the processing circuit 75 are electrically connected by the wiring 78b. The processing circuit 75 is, for example, a PLL circuit. The processing circuit 75 is included in the controller 70, for example. The processing circuit 75 is configured to detect a change in the resonance frequency obtained from the first movable portion 10. Thereby, for example, acceleration can be detected. The processing circuit 75 is configured to detect a change in the resonance frequency obtained from the second movable portion 10S. Thereby, for example, the angle can be detected. Angular velocity may be detected. A small sensor can be obtained.

As shown in FIG. 8B, in the sensor according to the embodiment, the first detection element 10U and the second detection element 10V may be provided between a container 10T and the lid portion 10R. The container 10T is, for example, a ceramic package. The space SP between the container 10T and the lid portion 10R is less than 1 atm. The base 50S is fixed to the container 10T by a fixing member 19 or the like. The fixing member 19 is, for example, a die bonding agent. The lid portion 10R may include, for example, at least one of ceramic and glass.

Fourth Embodiment

A fourth embodiment relates to an electronic device.

Figure 9:
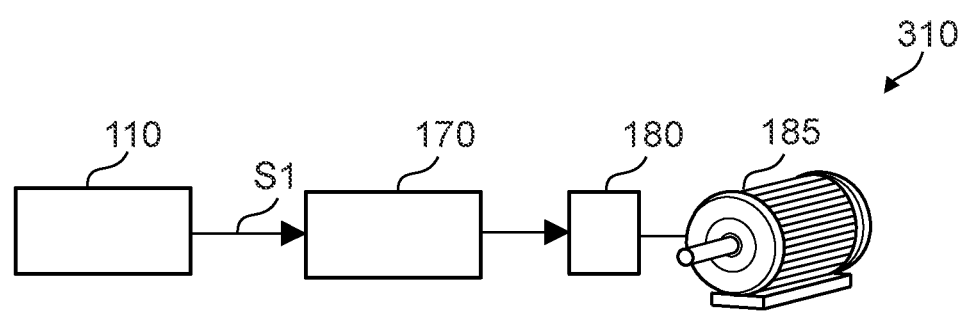
FIG. 9 is a schematic diagram illustrating an electronic device according to a fourth embodiment.

FIG. 9 is a schematic diagram illustrating an electronic device according to a fourth embodiment.

As shown in FIG. 9, an electronic device 310 according to the embodiment includes the sensors according to the first to third embodiments and the circuit processor 170. In the example of FIG. 9, the sensor 110 is drawn as the sensor. The circuit processor 170 is configured to control a circuit 180 based on the signal S1 obtained from the sensor. The circuit 180 is, for example, a control circuit for a drive device 185. According to the embodiment, for example, the circuit 180 for controlling the drive device 185 can be controlled with high accuracy.

FIGS. 10A to 10H are schematic views illustrating applications of the electronic device.

Figure 10A:
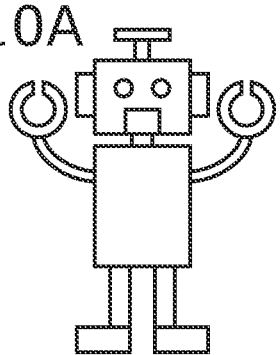
FIGS. 10A to 10H are schematic views illustrating the application of the electronic device.
Figure 10B:
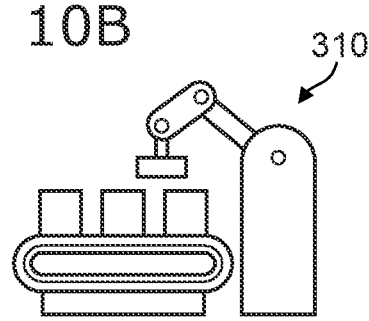
Figure 10C:
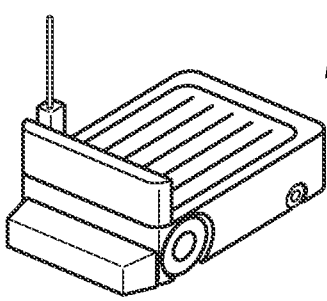
Figure 10D:
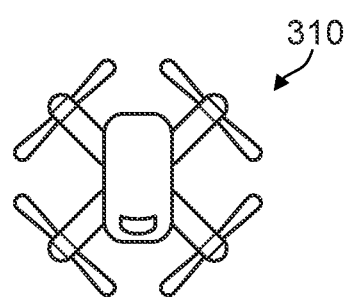
Figure 10E:
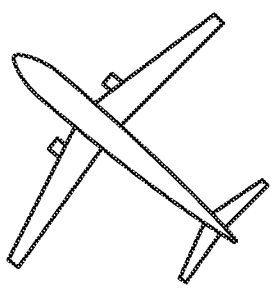
Figure 10F:
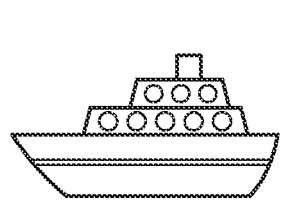
Figure 10G:
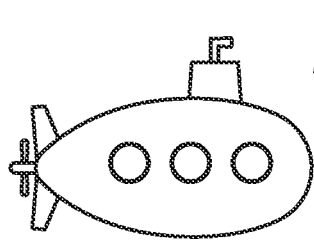
Figure 10H:
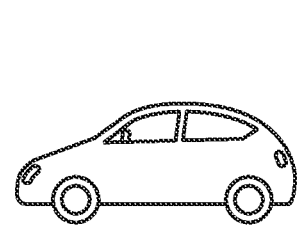

As shown in FIG. 10A, the electronic device 310 may be at least a portion of a robot. As shown in FIG. 10B, the electronic device 310 may be at least a portion of a machining robot provided in a manufacturing plant, etc. As shown in FIG. 10C, the electronic device 310 may be at least a portion of an automatic guided vehicle inside a plant, etc. As shown in FIG. 10D, the electronic device 310 may be at least a portion of a drone (an unmanned aircraft). As shown in FIG. 10E, the electronic device 310 may be at least a portion of an airplane. As shown in FIG. 10F, the electronic device 310 may be at least a portion of a ship. As shown in FIG. 10G, the electronic device 310 may be at least a portion of a submarine. As shown in FIG. 10H, the electronic device 310 may be at least a portion of an automobile. The electronic device 310 according to the third embodiment may include, for example, at least one of a robot or a moving body.

Fifth Embodiment

Figure 11A:
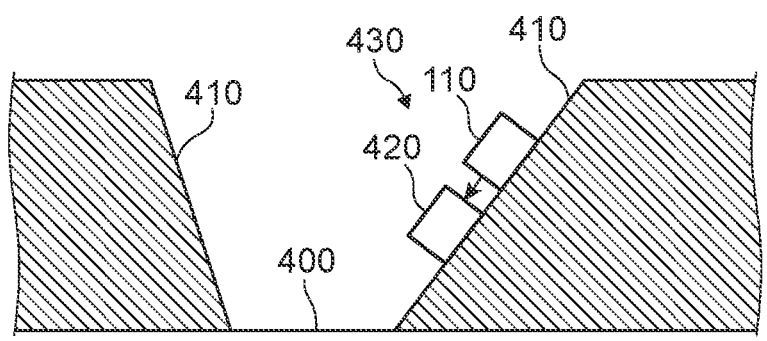
FIGS. 11A and 11B are schematic views illustrating the sensor according to a fifth embodiment.
Figure 11B:
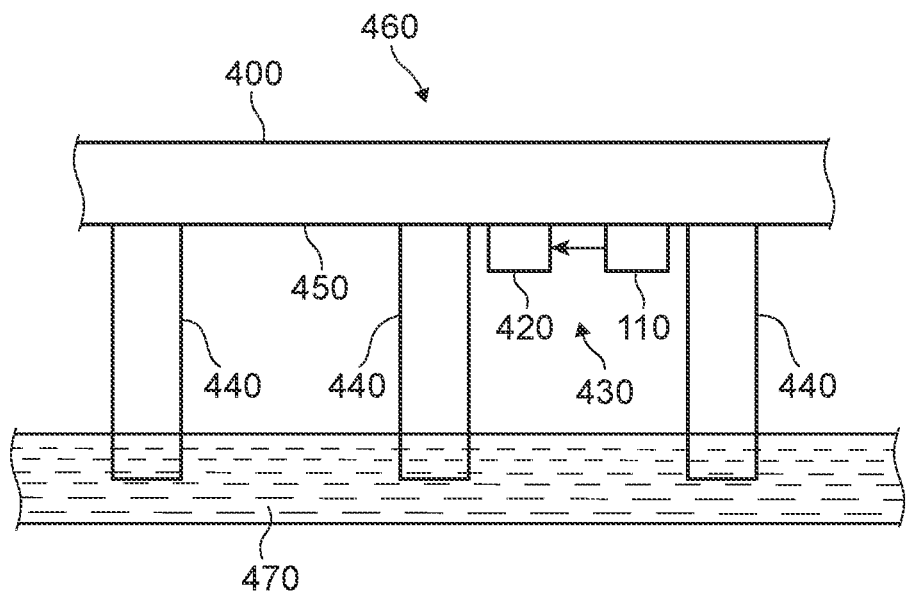

FIGS. 11A and 11B are schematic views illustrating a sensor according to the fifth embodiment.

As shown in FIG. 11A, a sensor 430 according to the fifth embodiment includes the sensor according to one of the first to third embodiments, and a transmission/reception part 420. In the example of FIG. 11A, the sensor 110 is illustrated as the sensor. The transmission/reception part 420 is configured to transmit the signal obtained from the sensor 110 by, for example, at least one of wireless and wired methods. The sensor 430 is provided on, for example, a slope surface 410 such as a road 400. The sensor 430 can monitor the state of, for example, a facility (e.g., infrastructure). The sensor 430 may be, for example, a state monitoring device.

For example, the sensor 430 detects a change in the state of a slope surface 410 of a road 400 with high accuracy. The change in the state of the slope surface 410 includes, for example, at least one of a change in the inclination angle and a change in the vibration state. The signal (inspection result) obtained from the sensor 110 is transmitted by the transmission/reception part 420. The status of a facility (e.g., infrastructure) can be monitored, for example, continuously.

As shown in FIG. 11B, the sensor 430 is provided, for example, in a portion of a bridge 460. The bridge 460 is provided above the river 470. For example, the bridge 460 includes at least one of a main girder 450 and a pier 440. The sensor 430 is provided on at least one of the main girder 450 and the pier 440. For example, at least one of the angles of the main girder 450 and the pier 440 may change due to deterioration or the like. For example, the vibration state may change in at least one of the main girder 450 and the pier 440. The sensor 430 detects these changes with high accuracy. The detection result can be transmitted to an arbitrary place by the transmission/reception part 420. Abnormalities can be detected effectively.

Embodiments include, for example, the following configurations (e.g., technological proposals).

Configuration 1

A sensor, comprising:
 a base;
 a first support portion fixed to the base; and
 a first movable portion supported by the first support portion and separated from the base,
 the first movable portion including:
  a first movable base portion supported by the first support portion,
  a second movable base portion, a second direction from the first movable base portion to the second movable base portion crossing a first direction from the base to the first movable portion,
  a connecting base portion provided between the first movable base portion and the second movable base portion, the connecting base portion connecting the second movable base portion to the first movable base portion,
  a first movable beam including a first beam end portion, a first beam other end portion, and a first beam intermediate portion, the first beam end portion being connected with the first movable base portion, the first beam other end portion being connected with the second movable base portion, the first beam intermediate portion is located between the first beam end portion and the first beam other end portion;

a second movable beam including a second beam end portion, a second beam other end portion, and a second beam intermediate portion, the second beam end portion being connected with the first movable base portion, the second beam other end portion being connected with the second movable base portion, the second beam intermediate portion being located between the second beam end portion and the second beam other end portion, the connection base portion being located between the first beam intermediate portion and the second beam intermediate portion in a third direction crossing a plane including the first direction and the second direction;

a first movable conductive portion connected with the first beam intermediate portion, the first beam intermediate portion being located between the first movable conductive portion and the connecting base portion in the third direction, the first movable conductive portion including:

a first crossing conductive portion connected with the first beam intermediate portion and extending along the third direction, a first extending conductive portion connected with the first crossing conductive portion and extending along the second direction, and a first other extending conductive portion connected with the first crossing conductive portion and extending along the second direction, the first other extending conductive portion being located between the first extending conductive portion and the first beam intermediate portion in the third direction; and a second movable conductive portion connected with the second beam intermediate portion, the second beam intermediate portion being located between the connecting base portion and the second movable conductive portion in the third direction, the second movable conductive portion including:

a second crossing conductive portion connected with the second beam intermediate portion and extending along the third direction;

a second extending conductive portion connected with the second crossing conductive portion and extending along the second direction, and a second other extending conductive portion connected with the second crossing conductive portion and extends along the second direction, the second other extending conductive portion being located between the second beam intermediate portion and the second extending conductive portion in the third direction.

Configuration 2

The sensor according to Configuration 1, wherein a length of the first other extending conductive portion along the second direction is longer than a length of the first extending conductive portion along the second direction, and a length of the second other extending conductive portion along the second direction is longer than a length of the second extending conductive portion along the second direction.

Configuration 3

The sensor according to Configuration 2, wherein the length of the first other extending conductive portion along the second direction is not less than 1.2 times the length of the first extending conductive portion along the second direction, and the length of the second other extending conductive portion along the second direction is not less than 1.2 times the length of the second extending conductive portion along the second direction.

Configuration 4

The sensor according to Configurations 2 or 3, wherein the length of the first other extending conductive portion along the second direction is longer than a length of the first other extending conductive portion along the third direction, and the length of the second other extending conductive portion along the second direction is longer than a length of the second other extending conductive portion along the third direction.

Configuration 5

The sensor according to one of Configurations 2 to 4, wherein the length of the first extending conductive portion along the second direction is longer than a length of the first crossing conductive portion along the second direction, and the length of the second extending conductive portion along the second direction is longer than a length of the second crossing conductive portion along the second direction.

Configuration 6

The sensor according to one of Configurations 2 to 5, wherein the first movable conductive portion further includes a first intermediate extending conductive portion, the first intermediate extending conductive portion is connected with the first crossing conductive portion and extends along the second direction, the first intermediate extending conductive portion is located between the first extending conductive portion and the first other extending conductive portion in the third direction, a length of the first intermediate extending conductive portion along the second direction is between the length of the first extending conductive portion along the second direction and the length of the first other extending conductive portion along the second direction, the second movable conductive portion further includes a second intermediate extending conductive portion, the second intermediate extending conductive portion is connected with the second crossing conductive portion and extends along the second direction, the second intermediate extending conductive portion is located between the second other extending conductive portion and the second extending conductive portion in the third direction, and a length of the second intermediate extending conductive portion along the second direction is between the length of the second other extending conductive portion along the second direction and the length of the second extending conductive portion along the second direction Configuration 7

The sensor according to one of Configurations 1 to 6, wherein a mass of the second movable conductive portion is different from a mass of the first movable conductive portion.

Configuration 8

The sensor according to one of Configurations 1 to 7, wherein
the first movable conductive portion includes a first hole,
the second movable conductive portion does not include a hole, or the second movable conductive portion includes a second hole; and
an area of the second hole in a plane including the second direction and the third direction is different from an area of the first hole in the plane.

Configuration 9

The sensor according to one of Configurations 1 to 7, wherein
the first movable conductive portion includes a plurality of first holes,
the second movable conductive portion includes a plurality of second holes, and
a sum of areas of the second holes in a plane including the second direction and the third direction is different from a sum of areas of the first holes in the plane.

Configuration 10

The sensor according to one of Configurations 1 to 7, wherein
the first movable conductive portion includes a plurality of first holes,
the second movable conductive portion includes a plurality of second holes, and
a number of the second holes is different from a number of the first holes.

Configuration 11

A sensor, comprising:
a base;
a first support portion fixed to the base; and
a first movable portion supported by the first support portion and separated from the base,
the first movable portion including:
a first movable base portion supported by the first support portion,
a second movable base portion, a second direction from the first movable base portion to the second movable base portion crossing a first direction from the base to the first movable portion,
a connecting base portion provided between the first movable base portion and the second movable base portion, the connecting base portion connecting the second movable base portion to the first movable base portion,
a first movable beam including a first beam end portion, a first beam other end portion, and a first beam intermediate portion, the first beam end portion being connected with the first movable base portion, the first beam other end portion being connected with the second movable base portion, the first beam intermediate portion being located between the first beam end portion and the first beam other end portion;
a second movable beam including a second beam end portion, a second beam other end portion, and a second beam intermediate portion, the second beam end portion being connected with the first movable base portion, the second beam other end portion being connected with the second movable base portion, the second beam intermediate portion being located between the second beam end portion and the second beam other end portion, the connection base portion being located between the first beam intermediate portion and the second beam intermediate portion in a third direction crossing a plane including the first direction and the second direction;
a first movable conductive portion connected with the first beam intermediate portion, the first beam intermediate portion being located between the first movable conductive portion and the connecting base portion in the third direction, the first movable conductive portion including a first extending conductive portion connected extending along the second direction, and
a second movable conductive portion connected with the second beam intermediate portion, the second beam intermediate portion being located between the connecting base portion and the second movable conductive portion in the third direction, the second movable conductive portion including a second extending conductive portion extending along the second direction,
the first movable conductive portion including one or more first holes,
the second movable conductive portion including one or more second holes,
a sum of areas of the one or more second holes in a plane including the second direction and the third direction being different from a sum of areas of the one or more first holes in the plane.

Configuration 12

The sensor according to Configuration 11, wherein
the first movable conductive portion includes the plurality of first holes,
the second movable conductive portion includes the plurality of second holes, and
a number of the second holes is different from a number of the first holes.

Configuration 13

The sensor according to one of Configurations 11 or 12, wherein a mass of the second movable conductive portion is different from a mass of the first movable conductive portion.

Configuration 14

The sensor according to one of Configurations 1 to 13, further comprising:
a first facing conductive portion facing at least a part of the first movable conductive portion; and
a second facing conductive portion facing at least a part of the second movable conductive portion.

Configuration 15

The sensor according to Configuration 14, wherein
at least a part of the first facing conductive portion is located between the first other extending conductive portion and the first extending conductive portion in the third direction, and
at least a part of the second facing conductive portion is located between the second other extending conductive portion and the second extending conductive portion in the third direction.

Configuration 16

The sensor according to one of Configurations 1 to 13, further comprising:
a first facing electrode facing at least a part of the first movable conductive portion; and
a second facing electrode facing at least a part of the second movable conductive portion.

Configuration 17
The sensor according to one of Configurations 1 to 13, further comprising:
a first structure body fixed to the base; and
a second structure body fixed to the base,
at least a part of the first structure body facing at least a part of the first movable conductive part in the third direction, and
at least a part of the second structure body facing at least a part of the second movable conductive portion in the third direction.

Configuration 18
The sensor according to one of Configurations 1 to 17, wherein
a length of the first movable base portion along the third direction is longer than the length of the connection base portion along the third direction, and
a length of the second movable base portion along the third direction is longer than the length of the connecting base portion along the third direction.

Configuration 19
The sensor according to one of Configurations 1 to 17, wherein
the first movable portion further includes a movable member,
the second movable base portion is provided between the first movable base portion and the movable member in the second direction,
a length of the movable member along the third direction is longer than a length of the second movable base portion along the third direction.

Configuration 20
An electronic device, comprising:
the sensor according to one of Configurations 1 to 19; and
a circuit controller configured to control a circuit based on a signal obtained from the sensor.

According to embodiments, a sensor and an electronic devices capable of improving characteristics can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as bases, support portions, movable portions, facing conductive portions, facing electrodes, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors, and electronic devices practicable by an appropriate design modification by one skilled in the art based on the sensors, and the electronic devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A sensor, comprising:
a base;
a first support portion fixed to the base; and
a first movable portion supported by the first support portion and separated from the base, a gap being provided between the base and first movable portion, no other support portion being provided between the base and the first movable portion,
the first movable portion including:
a first movable base portion supported by the first support portion,
a second movable base portion, a second direction from the first movable base portion to the second movable base portion crossing a first direction from the base to the first movable portion,
a connecting base portion provided between the first movable base portion and the second movable base portion, the connecting base portion connecting the second movable base portion to the first movable base portion,
a first movable beam including a first beam end portion, a first beam other end portion, and a first beam intermediate portion, the first beam end portion being connected with the first movable base portion, the first beam other end portion being connected with the second movable base portion, the first beam intermediate portion is located between the first beam end portion and the first beam other end portion;
a second movable beam including a second beam end portion, a second beam other end portion, and a second beam intermediate portion, the second beam end portion being connected with the first movable base portion, the second beam other end portion being connected with the second movable base portion, the second beam intermediate portion being located between the second beam end portion and the second beam other end portion, the connection base portion being located between the first beam intermediate portion and the second beam intermediate portion in a third direction crossing a plane including the first direction and the second direction;
a first movable conductive portion connected with the first beam intermediate portion, the first beam intermediate portion being located between the first movable conductive portion and the connecting base portion in the third direction, the first movable conductive portion including:
a first crossing conductive portion connected with the first beam intermediate portion and extending along the third direction,
a first extending conductive portion connected with the first crossing conductive portion and extending along the second direction, and
a first other extending conductive portion connected with the first crossing conductive portion and extending along the second direction, the first other extending conductive portion being located between the first extending conductive portion and the first beam intermediate portion in the third direction; and
a second movable conductive portion connected with the second beam intermediate portion, the second beam intermediate portion being located between the connecting base portion and the second movable conductive portion in the third direction, the second movable conductive portion including:
a second crossing conductive portion connected with the second beam intermediate portion and extending along the third direction;
a second extending conductive portion connected with the second crossing conductive portion and extending along the second direction, and
a second other extending conductive portion connected with the second crossing conductive portion and extends along the second direction, the second other extending conductive portion being located between the second beam intermediate portion and the second extending conductive portion in the third direction; and
further comprising:
a first facing conductive portion facing at least a part of the first movable conductive portion; and
a second facing conductive portion facing at least a part of the second movable conductive portion,
wherein
at least a part of the first facing conductive portion is located between the first other extending conductive portion and the first extending conductive portion in the third direction, and
at least a part of the second facing conductive portion is located between the second other extending conductive portion and the second extending conductive portion in the third direction.

2. The sensor according to claim 1, wherein
a length of the first other extending conductive portion along the second direction is longer than a length of the first extending conductive portion along the second direction, and
a length of the second other extending conductive portion along the second direction is longer than a length of the second extending conductive portion along the second direction.

3. The sensor according to claim 2, wherein
the length of the first other extending conductive portion along the second direction is not less than 1.2 times the length of the first extending conductive portion along the second direction, and
the length of the second other extending conductive portion along the second direction is not less than 1.2 times the length of the second extending conductive portion along the second direction.

4. The sensor according to claim 2, wherein
the length of the first other extending conductive portion along the second direction is longer than a length of the first other extending conductive portion along the third direction, and
the length of the second other extending conductive portion along the second direction is longer than a length of the second other extending conductive portion along the third direction.

5. The sensor according to claim 2, wherein
the length of the first extending conductive portion along the second direction is longer than a length of the first crossing conductive portion along the second direction, and
the length of the second extending conductive portion along the second direction is longer than a length of the second crossing conductive portion along the second direction.

6. The sensor according to claim 2, wherein
the first movable conductive portion further includes a first intermediate extending conductive portion,
the first intermediate extending conductive portion is connected with the first crossing conductive portion and extends along the second direction,
the first intermediate extending conductive portion is located between the first extending conductive portion and the first other extending conductive portion in the third direction,
a length of the first intermediate extending conductive portion along the second direction is between the length of the first extending conductive portion along the second direction and the length of the first other extending conductive portion along the second direction,
the second movable conductive portion further includes a second intermediate extending conductive portion,
the second intermediate extending conductive portion is connected with the second crossing conductive portion and extends along the second direction,
the second intermediate extending conductive portion is located between the second other extending conductive portion and the second extending conductive portion in the third direction, and
a length of the second intermediate extending conductive portion along the second direction is between the length of the second other extending conductive portion along the second direction and the length of the second extending conductive portion along the second direction.

7. The sensor according to claim 1, wherein a mass of the second movable conductive portion is different from a mass of the first movable conductive portion.

8. The sensor according to claim 1, wherein
the first movable conductive portion includes a first hole,
the second movable conductive portion does not include a hole, or the second movable conductive portion includes a second hole; and
an area of the second hole in a plane including the second direction and the third direction is different from an area of the first hole in the plane.

9. The sensor according to claim 1, wherein
the first movable conductive portion includes a plurality of first holes,
the second movable conductive portion includes a plurality of second holes, and
a sum of areas of the second holes in a plane including the second direction and the third direction is different from a sum of areas of the first holes in the plane.

10. The sensor according to claim 1, wherein
the first movable conductive portion includes a plurality of first holes,
the second movable conductive portion includes a plurality of second holes, and
a number of the second holes is different from a number of the first holes.

11. The sensor according to claim 1, further comprising:
a first facing electrode facing at least a part of the first movable conductive portion; and
a second facing electrode facing at least a part of the second movable conductive portion.

12. The sensor according to claim 1, further comprising:
a first structure body fixed to the base; and
a second structure body fixed to the base,
at least a part of the first structure body facing at least a part of the first movable conductive part in the third direction, and
at least a part of the second structure body facing at least a part of the second movable conductive portion in the third direction.

13. The sensor according to claim 1, wherein
a length of the first movable base portion along the third direction is longer than the length of the connection base portion along the third direction, and
a length of the second movable base portion along the third direction is longer than the length of the connecting base portion along the third direction.

14. The sensor according to claim 1, wherein
the first movable portion further includes a movable member,
the second movable base portion is provided between the first movable base portion and the movable member in the second direction, and
a length of the movable member along the third direction is longer than a length of the second movable base portion along the third direction.

15. An electronic device, comprising:
the sensor according to claim 1; and
a circuit controller configured to control a circuit based on a signal obtained from the sensor.

16. A sensor, comprising:
a base;
a first support portion fixed to the base; and
a first movable portion supported by the first support portion and separated from the base,
the first movable portion including:
  a first movable base portion supported by the first support portion,
  a second movable base portion, a second direction from the first movable base portion to the second movable base portion crossing a first direction from the base to the first movable portion,
  a connecting base portion provided between the first movable base portion and the second movable base portion, the connecting base portion connecting the second movable base portion to the first movable base portion,
  a first movable beam including a first beam end portion, a first beam other end portion, and a first beam intermediate portion, the first beam end portion being connected with the first movable base portion, the first beam other end portion being connected with the second movable base portion, the first beam intermediate portion is located between the first beam end portion and the first beam other end portion;
  a second movable beam including a second beam end portion, a second beam other end portion, and a second beam intermediate portion, the second beam end portion being connected with the first movable base portion, the second beam other end portion being connected with the second movable base portion, the second beam intermediate portion being located between the second beam end portion and the second beam other end portion, the connection base portion being located between the first beam intermediate portion and the second beam intermediate portion in a third direction crossing a plane including the first direction and the second direction;
  a first movable conductive portion connected with the first beam intermediate portion, the first beam intermediate portion being located between the first movable conductive portion and the connecting base portion in the third direction, the first movable conductive portion including:
    a first crossing conductive portion connected with the first beam intermediate portion and extending along the third direction,
    a first extending conductive portion connected with the first crossing conductive portion and extending along the second direction, and
    a first other extending conductive portion connected with the first crossing conductive portion and extending along the second direction, the first other extending conductive portion being located between the first extending conductive portion and the first beam intermediate portion in the third direction; and
  a second movable conductive portion connected with the second beam intermediate portion, the second beam intermediate portion being located between the connecting base portion and the second movable conductive portion in the third direction, the second movable conductive portion including:
    a second crossing conductive portion connected with the second beam intermediate portion and extending along the third direction;
    a second extending conductive portion connected with the second crossing conductive portion and extending along the second direction;
    a second other extending conductive portion connected with the second crossing conductive portion and extends along the second direction, the second other extending conductive portion being located between the second beam intermediate portion and the second extending conductive portion in the third direction;
  a first facing conductive portion facing at least a part of the first movable conductive portion; and
  a second facing conductive portion facing at least a part of the second movable conductive portion;
wherein
  at least a part of the first facing conductive portion is located between the first other extending conductive portion and the first extending conductive portion in the third direction, and
  at least a part of the second facing conductive portion is located between the second other extending conductive portion and the second extending conductive portion in the third direction.

* * * * *